US009412619B2

(12) United States Patent
Kumar et al.

(10) Patent No.: US 9,412,619 B2
(45) Date of Patent: Aug. 9, 2016

(54) METHOD OF OUTGASSING A MASK MATERIAL DEPOSITED OVER A WORKPIECE IN A PROCESS TOOL

(71) Applicant: Applied Materials, Inc., Santa Clara, CA (US)

(72) Inventors: Prabhat Kumar, Fremont, CA (US); Wei-Sheng Lei, San Jose, CA (US); Martin S. Wohlert, San Jose, CA (US); James S. Papanu, San Rafael, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 117 days.

(21) Appl. No.: 14/458,220

(22) Filed: Aug. 12, 2014

(65) Prior Publication Data

US 2016/0049313 A1 Feb. 18, 2016

(51) Int. Cl.
*H01L 21/20* (2006.01)
*H01L 21/322* (2006.01)
*H01L 21/67* (2006.01)
*H01L 21/673* (2006.01)
*H01L 21/677* (2006.01)

(52) U.S. Cl.
CPC ...... *H01L 21/3221* (2013.01); *H01L 21/67115* (2013.01); *H01L 21/67196* (2013.01); *H01L 21/67201* (2013.01); *H01L 21/67207* (2013.01); *H01L 21/67393* (2013.01); *H01L 21/67739* (2013.01); *H01L 21/67748* (2013.01)

(58) Field of Classification Search
CPC ........... H01L 21/322; H01L 21/67; B01J 3/00
USPC ...................................... 438/471; 156/345.31
See application file for complete search history.

(56) References Cited

U.S. PATENT DOCUMENTS

| 6,107,192 | A  | * | 8/2000  | Subrahmanyan et al. ..... 438/637 |
| 6,361,618 | B1 | * | 3/2002  | Nulman .......................... 134/21 |
| 6,372,645 | B1 | * | 4/2002  | Liu et al. ....................... 438/688 |
| 6,530,992 | B1 | * | 3/2003  | Yang et al. .................... 118/695 |
| 6,660,622 | B2 | * | 12/2003 | Chen et al. .................... 438/595 |
| 6,707,545 | B1 | * | 3/2004  | Hunter ....................... 356/237.5 |
| 6,777,045 | B2 | * | 8/2004  | Lin et al. ...................... 428/34.6 |
| 6,813,032 | B1 | * | 11/2004 | Hunter ........................... 356/601 |
| 6,955,928 | B1 | * | 10/2005 | Brennan ......................... 438/14 |
| 7,012,684 | B1 | * | 3/2006  | Hunter ....................... 356/237.5 |
| 8,815,724 | B2 | * | 8/2014  | Ganguli et al. ............... 438/583 |
| 2001/0043453 | A1 | * | 11/2001 | Narwankar et al. ........ 361/306.3 |

(Continued)

*Primary Examiner* — Caleb Henry
(74) *Attorney, Agent, or Firm* — Blakely Sokoloff Taylor & Zafman LLP

(57) ABSTRACT

Embodiments of the invention include methods and apparatuses for outgassing a workpiece prior to a plasma processing operation. An embodiment of the invention may comprise transferring a workpiece having a mask to an outgassing station that has one or more heating elements. The workpiece may then be heated to an outgassing temperature that causes moisture from the mask layer to be outgassed. After outgassing the workpiece, the workpiece may be transferred to a plasma processing chamber. In an additional embodiment, one or more outgassing stations may be located within a process tool that has a factory interface, a load lock coupled to the factory interface, a transfer chamber coupled to the load lock, and a plasma processing chamber coupled to the transfer chamber. According to an embodiment, an outgassing station may be located within any of the components of the process tool.

14 Claims, 7 Drawing Sheets

(56) References Cited

U.S. PATENT DOCUMENTS

| | | |
|---|---|---|
| 2002/0006677 A1* | 1/2002 | Egermeier et al. ............. 438/14 |
| 2002/0166632 A1* | 11/2002 | Brezoczky et al. ........ 156/345.1 |
| 2002/0192845 A1* | 12/2002 | Nguyen et al. ................... 438/9 |
| 2003/0017628 A1* | 1/2003 | Li et al. .......................... 438/14 |
| 2003/0017694 A1* | 1/2003 | Nguyen et al. ................ 438/637 |
| 2003/0022487 A1* | 1/2003 | Yoon et al. ................... 438/642 |
| 2003/0027427 A1* | 2/2003 | Ma et al. ...................... 438/700 |
| 2003/0176075 A1* | 9/2003 | Khan et al. ................... 438/714 |
| 2003/0215962 A1* | 11/2003 | Hausmann et al. .............. 438/7 |
| 2004/0211665 A1* | 10/2004 | Yoon et al. ............... 204/298.01 |
| 2005/0230344 A1* | 10/2005 | Koschinsky et al. ............ 216/17 |
| 2006/0075968 A1* | 4/2006 | Leung et al. ............... 118/723 R |
| 2007/0202254 A1* | 8/2007 | Ganguli et al. ................ 427/252 |
| 2008/0238699 A1* | 10/2008 | Byrne et al. ................... 340/632 |
| 2008/0268635 A1* | 10/2008 | Yu et al. ........................ 438/655 |
| 2009/0004850 A1* | 1/2009 | Ganguli et al. ................ 438/655 |
| 2009/0294920 A1* | 12/2009 | Chudzik et al. ............... 257/632 |
| 2011/0095207 A1* | 4/2011 | Sant et al. ................... 250/492.2 |
| 2011/0097902 A1* | 4/2011 | Singh et al. ................... 438/710 |
| 2011/0124192 A1* | 5/2011 | Ganguli et al. ................ 438/653 |
| 2014/0157863 A1* | 6/2014 | Yang .............................. 73/23.2 |
| 2014/0327117 A1* | 11/2014 | Bencher et al. ............... 257/649 |
| 2015/0024594 A1* | 1/2015 | Fischer et al. ................ 438/689 |

* cited by examiner

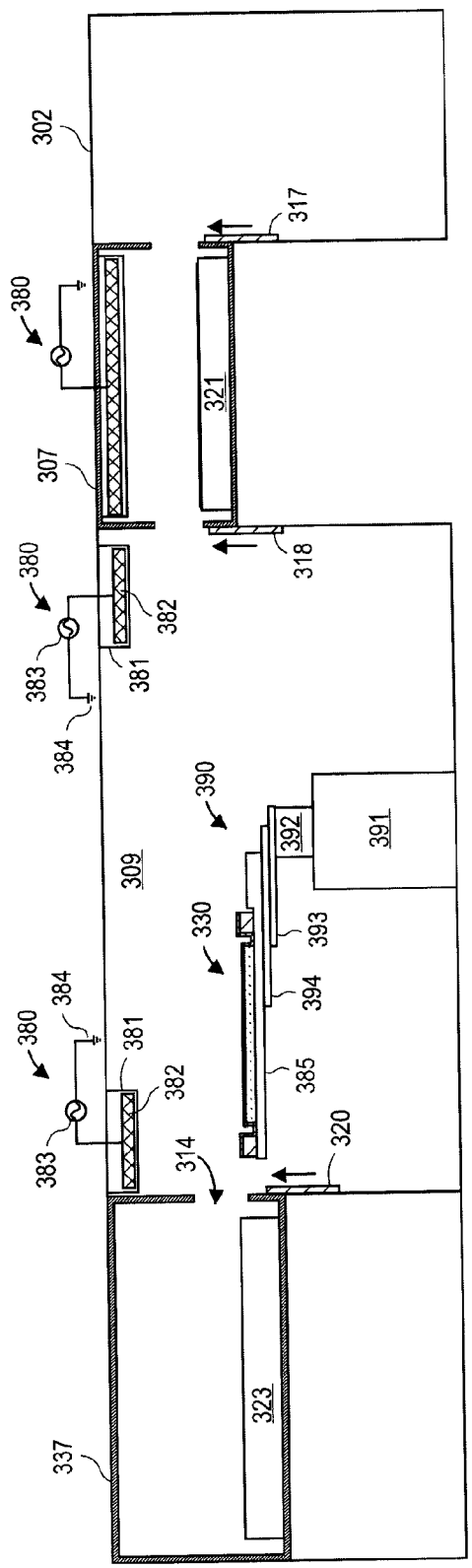
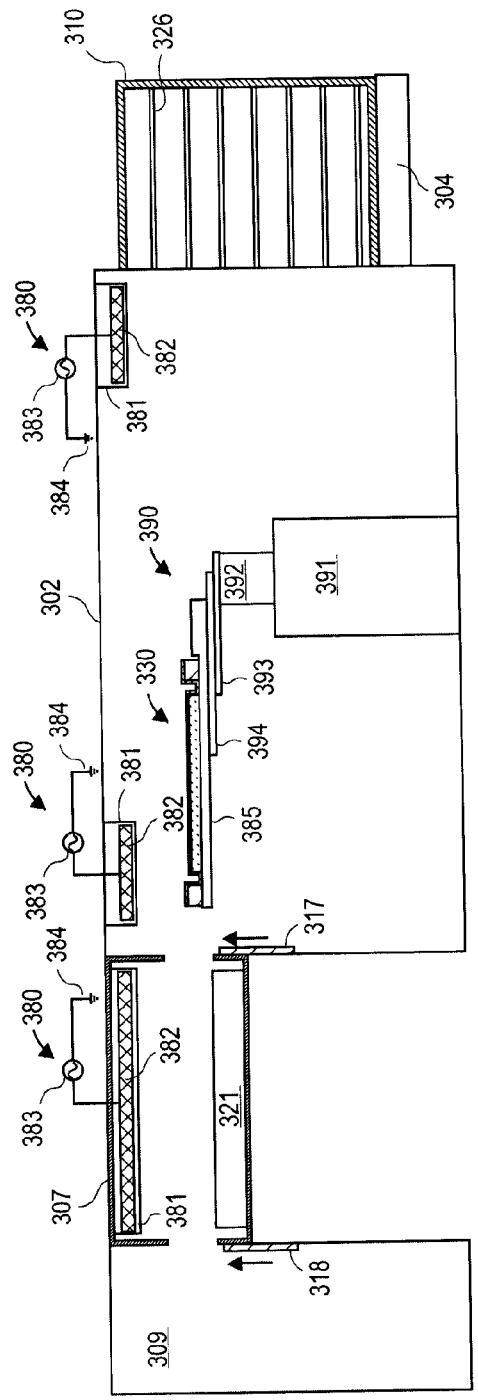
FIG. 3C
FIG. 3D

METHOD OF OUTGASSING A MASK MATERIAL DEPOSITED OVER A WORKPIECE IN A PROCESS TOOL

BACKGROUND

1) Field

Embodiments of the present invention pertain to the field of semiconductor processing and, in particular, to methods and apparatuses for outgassing materials.

2) Description of Related Art

In a plasma process, accurate control of the vacuum pressure and the flow rate of processing gasses are needed to ensure that a plasma with the desired characteristics is obtained. For example, the pressure and flow rate of processing gasses may be chosen in order to optimize an etch rate in a plasma etching process. However, materials that are being processed in the chamber may outgas when subjected to the low pressures in a plasma process. The outgassed substances may alter the properties of the plasma. For example, in a plasma etching operation, outgassing from the material being processed may decrease the etch rate. The decreased etch rate reduces the throughput of the vacuum chamber. Furthermore, without the ability to control the outgassing, the repeatability of the process may be reduced since some workpieces may outgas more than others.

Accordingly, materials that will be processed in a vacuum chamber are carefully selected for their outgassing properties. Materials with low leak rates are needed in order to ensure that outgassing is minimized. For example, polymers and adhesives typically have high leak rates and are generally not used in plasma processing operations. Attempts to control the outgassing of high leak rate materials may include the use of a hard bake to drive off some of the gasses or liquids, such as water, that may be retained by the material. However, moisture may absorb or adsorb back into the material when the temperature of the workpiece is reduced after the hard bake. As such, there may still be retained gasses or liquids in the material that may outgas when the workpiece is processed in a plasma processing chamber.

SUMMARY

Embodiments of the invention include methods and apparatuses for outgassing a workpiece prior to a plasma processing operation. An embodiment of the invention may comprise forming a mask layer over a workpiece. The workpiece may then be transferred to an outgassing station that has one or more heating elements. The workpiece may then be heated to an outgassing temperature that causes moisture from the mask layer to be outgassed. After outgassing the workpiece, the workpiece may be transferred to a plasma processing chamber.

In an additional embodiment, the outgassing station may be located within a process tool that has a factory interface, a load lock coupled to the factory interface, a transfer chamber coupled to the load lock, and a plasma processing chamber coupled to the transfer chamber. The outgassing station may be located within any of the components of the process tool. For example, the outgassing station may be within the load lock. According to such an embodiment, the outgassing process may include pumping down the load lock to a vacuum pressure when the workpiece is in the load lock. In an embodiment, the workpiece may be heated while the load lock is pumped down to a vacuum pressure.

An additional embodiment of the invention may include a process tool for implementing a plasma process on a workpiece. In and embodiment, the process tool may include a plasma processing chamber, a transfer chamber coupled to the plasma processing chamber, a load lock coupled to the transfer chamber, a factory interface coupled to the load lock, and one or more outgassing stations located within one or more of the transfer chamber, the load lock, or the factory interface. By way of example, each of the one or more outgassing stations may have one or more heating elements.

BRIEF DESCRIPTION OF THE DRAWINGS

FIG. 3C is a cross-sectional illustration of a transfer chamber that includes a plurality of outgassing stations according to an embodiment of the invention.

FIG. 3D is a cross-sectional illustration of a factory interface that includes a plurality of outgassing stations according to an embodiment of the invention.

DETAILED DESCRIPTION

Figure 1:
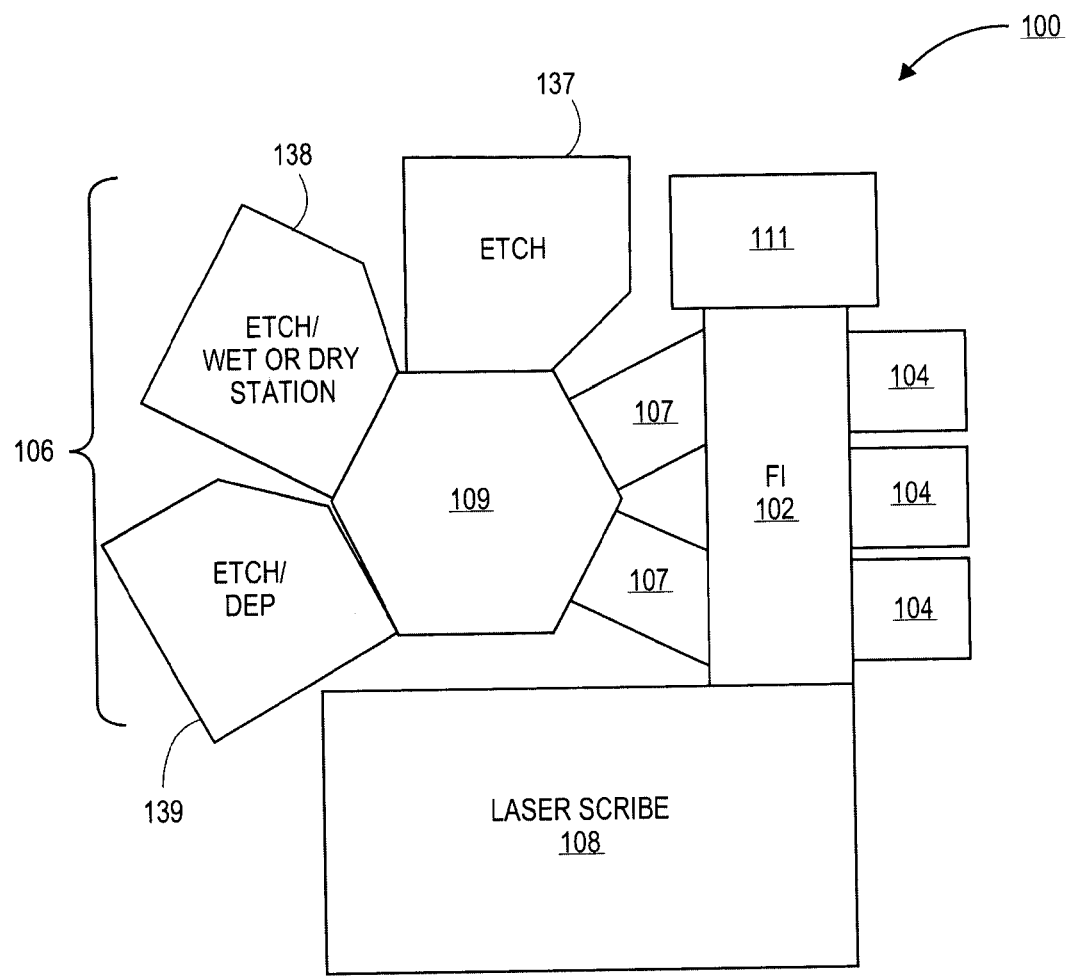
FIG. 1 illustrates an overhead block diagram of a process tool according to an embodiment of the invention.

Methods and apparatuses used for outgassing a workpiece prior to plasma processing are described in accordance with various embodiments. In the following description, numerous specific details are set forth, such as tape frames, semiconducting substrates, semiconductor processing tools, and outgassing stations, in order to provide a thorough understanding of embodiments of the present invention. It will be apparent to one skilled in the art that embodiments of the present invention may be practiced without these specific details. In other instances, well-known aspects are not described in detail in order to not unnecessarily obscure embodiments of the invention. Furthermore, it is to be understood that the various embodiments shown in the Figures are illustrative representations and are not necessarily drawn to scale.

Embodiments of the invention allow plasma processing to be used on workpieces that include materials that have high leak rates, such as polymers and adhesives. Despite the high leak rate of some of the materials on the workpiece, the plasma process is not negatively affected because the workpiece is outgassed prior to plasma processing, according to embodiments of the invention. During the plasma process, there may be substantially no moisture remaining in the workpiece that will outgas and reduce the efficiency of the plasma process. Therefore, embodiments of the invention are able maintain the throughput of the plasma processing chamber while allowing increased flexibility in the materials that may be processed.

In additional embodiments, the outgassing is also performed at a vacuum pressure and the workpiece is not subjected to an environment with a higher pressure until after the plasma processing operation. Therefore, substantially all of the moisture is removed from the workpiece, and the workpiece is not exposed to an environment that contains additional moisture that could be absorbed by the workpiece. As such, the outgassing within the processing chamber may be reduced further.

Further embodiments perform the outgassing operation concurrently with other processes prior to the plasma processing operation. In embodiments, the outgassing operation may be performed as the workpiece is being transferred from a front opening unified pod (FOUP) to the plasma processing chamber. For example, the outgassing operation may be performed while the workpiece is stored in or passing through one or more locations, such as, within the FOUP, in the factory interface, in the load lock, or in the transfer chamber. Since the outgassing operation may be performed concurrently with other processes, the outgassing operation does not increase the overall processing time of a workpiece, and therefore, does not decrease the throughput.

Additionally, embodiments of the invention include processing operations that may increase the rate at which the outgassing occurs. For example, a hybrid laser and plasma dicing process, such as the one described in greater detail below, may increase the rate of outgassing when the workpiece is at an outgassing station prior to the plasma etching process. In such embodiments, the laser scribing portion of the dicing process may improve the outgassing rate by creating scribe lines through the mask layer. The scribe lines create sidewalls in the mask layer that increase the exposed surface area of the mask. The increased surface area results in an increase in the rate at which the moisture outgasses from the workpiece. Accordingly, the time needed to outgas the workpiece prior to processing may be reduced.

Referring now to FIG. 1, a process tool 100 is illustrated. In an embodiment, methods and apparatuses for outgassing a workpiece may be used in conjunction with a process tool, such as process tool 100. In an embodiment, a process tool 100 includes one or more load ports 104 and a factory interface 102. The process tool 100 may include a cluster tool 106 that is coupled to the factory interface 102 by one or more load locks 107. The cluster tool 106 includes a transfer chamber 109. The transfer chamber 109 may be maintained at a vacuum pressure in order to facilitate transfer of workpieces between chambers without having to pump down the pressure between each processing operation. As used herein, a vacuum pressure may be any pressure below atmospheric pressure. Additional embodiments may include a vacuum pressure that is 1.0 mTorr or below. By way of example, a vacuum pressure may be between 1.0 mTorr and $1.0 \times 10^{-9}$ mTorr. In an embodiment, a robot is located in the transfer chamber 109 and is configured to transfer workpieces between the load locks 107 and a process chamber, or between different process chambers in a vacuum environment. In an embodiment, the cluster tool 106 also includes one or more plasma etch chambers 137. In an embodiment, the process tool 100 includes a laser scribe apparatus 108.

In an embodiment, the laser scribe apparatus 108 houses a femtosecond-based laser. The femtosecond-based laser may be suitable for performing a laser ablation portion of a hybrid laser and plasma etch singulation process of individual device dies formed on a substrate, such as a silicon wafer that is supported by a tape frame. In one embodiment, a moveable stage is also included in the laser scribe apparatus 108, the moveable stage configured for moving a substrate supported by a tape frame relative to the femtosecond-based laser. In another embodiment, the femtosecond-based laser is also moveable.

In an embodiment, the one or more plasma etch chambers 137 in the cluster tool 106 may be suitable for performing an etching portion of a hybrid laser and etch singulation process of individual device dies formed on a substrate that is supported by a tape frame. An etch chamber may be configured for etching a substrate through the gaps in a patterned mask. In one such embodiment, the one or more plasma etch chambers 137 in the cluster tool 106 is configured to perform a deep silicon etch process. In a specific embodiment, the one or more plasma etch chambers is an Applied Centura® Silvia™ Etch system, available from Applied Materials of Sunnyvale, Calif., USA. The etch chamber may be specifically designed for a deep silicon etch used to singulate integrated circuits housed on or in single crystalline silicon substrates or wafers. In an embodiment, a high-density plasma source is included in the plasma etch chamber to facilitate high silicon etch rates.

Cluster tool 106 may include other chambers suitable for performing functions in a method of singulation. For example, in one embodiment, in place of an additional etch chamber, a deposition chamber 139 is included. The deposition chamber 139 may be configured for mask deposition on or above a device layer of a wafer or a substrate. In one such embodiment, the deposition chamber 139 is suitable for depositing a water soluble mask. In another embodiment, in place of an additional etch chamber, a wet/dry station 138 is included. The wet/dry station 138 may be suitable for cleaning residues and fragments, or for removing a water soluble mask, subsequent to a laser scribe and plasma etch singulation process of a substrate or a wafer. In an embodiment, a metrology station (not shown) is also included as a component of process tool 100.

In an embodiment, process tool 100 may also include a spin coating tool 111. By way of example, a spin coating tool 111 may be used to form a mask layer over the workpiece. By way of example, the spin coating tool may dispense a viscous material over the workpiece, and then rotate the workpiece to spread the coating material by centrifugal force in order to form the mask over the surface. By way of example, the spin coating tool 111 may also include a hot plate that is able to perform a hard bake for curing the mask layer.

In an embodiment, the factory interface 102 may be a suitable atmospheric port to interface with the load ports 104, with the laser scribe tool 108, with the load locks 107, and with the spin coating tool 111. The factory interface 102 may include one or more transfer robots according to embodiments described in greater detail below. The one or more robot arms may be used for transferring workpieces from FOUPs docked at the load ports 104 into either load locks 107, laser scribe apparatus 108, and/or spin coating tool 111.

Figure 2A:
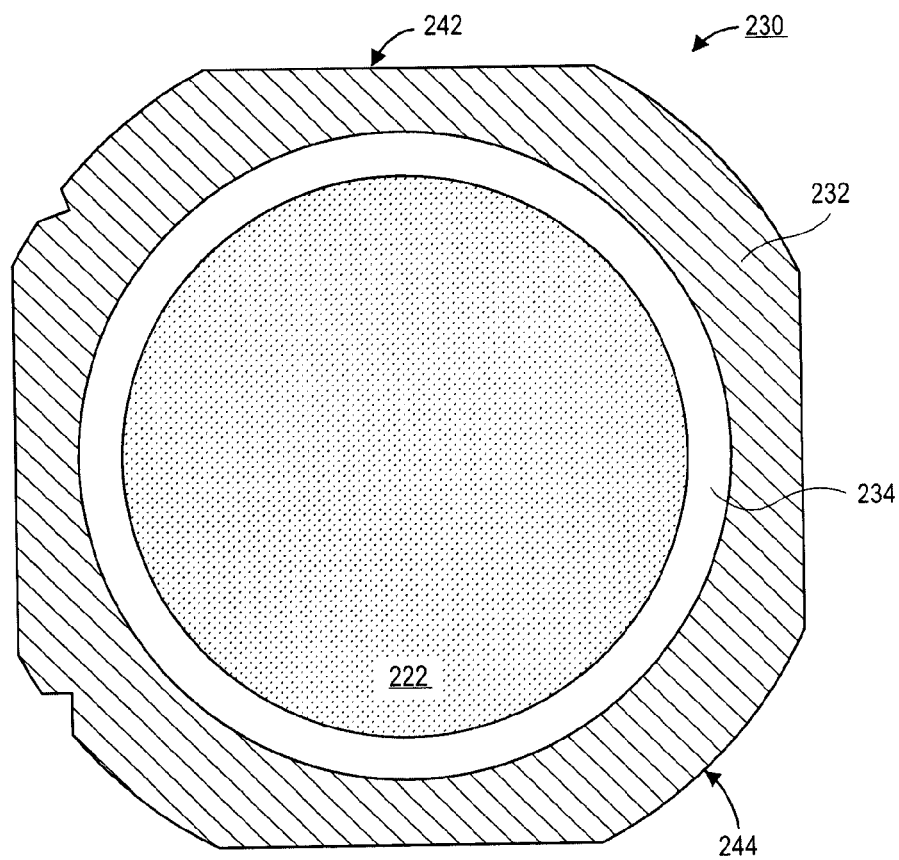
FIG. 2A illustrates an overhead view of a workpiece according to an embodiment of the invention.
Figure 2B:
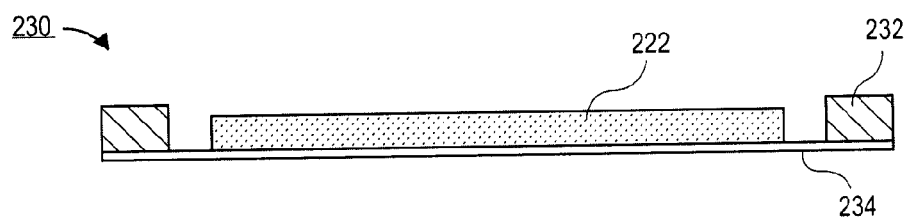
FIGS. 2B-2C are cross-sectional illustrations of a workpiece according to an embodiment of the invention.

According to an embodiment, the workpiece processed in the process tool 100 may be a tape frame that supports a substrate. Such a workpiece 230 is illustrated in FIG. 2A. In an embodiment, the workpiece 230 includes a tape frame 232, an adhesive backing tape 234 and a substrate 222. The layer of adhesive backing tape 234 is surrounded by the tape frame 232. As illustrated in the cross-sectional view of the workpiece 230 in FIG. 2B, the substrate 222 is supported by the backing tape 234. In an embodiment, the tape frame 232 may be a metallic material. For example, the tape frame 232 may be a stainless steel. In an additional embodiment, the tape frame 232 may be a non-metallic material, such as a polymeric material or a resin. In an embodiment, the substrate 222 is a commercially available silicon wafer, such as a 300 mm silicon wafer. Additional embodiments include a workpiece 230 sized for carrying a larger or smaller substrate, such as 200 mm or 450 mm substrates. Substrate 222 may have a plurality of individual device dies (not shown) that each include integrated circuitry formed thereon.

In an embodiment, tape frame 232 has one or more flat edges 242. As shown in FIG. 2A, the tape frame 232 includes four flat edges 242. In an embodiment, the width of the tape frame 232 between opposing flat edges is approximately 380 mm, though embodiments are not limited to such configurations. For example, a tape frame 232 for carrying a larger substrate 222 may have a width greater than 380 mm. Embodiments include a tape frame 232 that has rounded edges 244 that are formed between flat edges 242. In an embodiment, the tape frame may also include an alignment notch and flat.

While specific reference is made herein to workpieces 230 that include substrates 222 that are silicon wafers, embodiments are not so limited. Substantially similar methods and apparatuses to those described herein may be used to process a workpiece 230 that supports substrates other than a single silicon wafer. For example, a workpiece 230 for carrying multiple substrates may be utilized according to embodiments of the invention. For example, a workpiece 230 utilized for processing light emitting diodes (LEDs) formed on a plurality of sapphire substrates may be used according to an embodiment of the invention. Additional embodiments include a workpiece 230 that comprises a substrate that is not supported by a tape frame. For example, a silicon wafer, a sapphire substrate, a glass substrate, a III-V semiconductor substrate, or any other substrate used in plasma processing operations may be considered a workpiece according to embodiments of the invention. Additional embodiments may include workpieces 230 that are used in any micro or nano-fabrication process. For example, the workpieces 230 may be used for forming electrical circuits and devices, such as microprocessors, or for forming micro-electromechanical systems (MEMS).

Figure 2C:
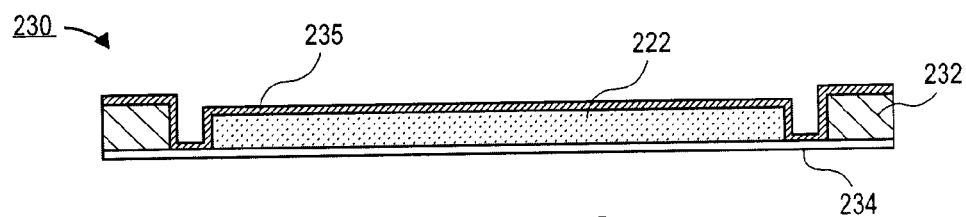

According to embodiments of the invention, the workpiece 230 may include a mask layer 235 that is formed over the substrate 222, as illustrated in the cross-sectional view in FIG. 2C. In an embodiment, the mask layer 235 may be a polymeric material that is resistant to a plasma used in a plasma etching process. In an embodiment, the mask layer 235 may be a water soluble polymer. For example, the mask layer may be polyvinyl alcohol (PVA), polyvinyl chloride (PVC), or the like. Additional embodiments include a mask layer 235 that is formed from polymeric materials used in underfill applications such as thermoset polymers or epoxies. In certain embodiments, the mask layer may also be formed over the adhesive tape 234 and the tape frame 232 in order to prevent the plasma from etching the adhesive tape 234 or the tape frame 232. In addition to protecting the adhesive tape 234 from being etched away, the mask layer 235 may also be used to prevent the adhesive tape 234 from outgassing during a plasma process.

In an embodiment, the mask layer 235 may be formed over the workpiece 230 with a spin coating process. After the mask layer 235 is formed, the mask layer 235 may be hard baked. By way of example, the hard bake may be performed by heating the workpiece 230 to a temperature between approximately 45° C. and approximately 60° C. for between approximately 5 and 60 minutes. During the hard bake, moisture and other volatiles, such as solvents, may be driven from the mask layer 235. However, since the mask layer 235 is a polymeric material that may be water soluble, the mask layer 235 may begin absorbing moisture or other gasses from the atmosphere as the temperature of the workpiece 230 decreases after the hard bake. The retention of moisture and/or solvents in the mask layer 235 is problematic because the materials used for the mask layer have a high leak rate. For example, water soluble polymeric materials have a leak rate that may be greater than approximately 1.0 mTorr. Accordingly, the mask layer 235 may be a source of outgassing during the plasma processing even if the mask layer 235 has been hard baked. As such, embodiments of the invention include methods and apparatuses for outgassing the mask layer 235 after the mask layer 235 has been formed and prior to a plasma processing operation in order to prevent outgassing from the deposited mask layer during the plasma processing operation.

Figure 3A:
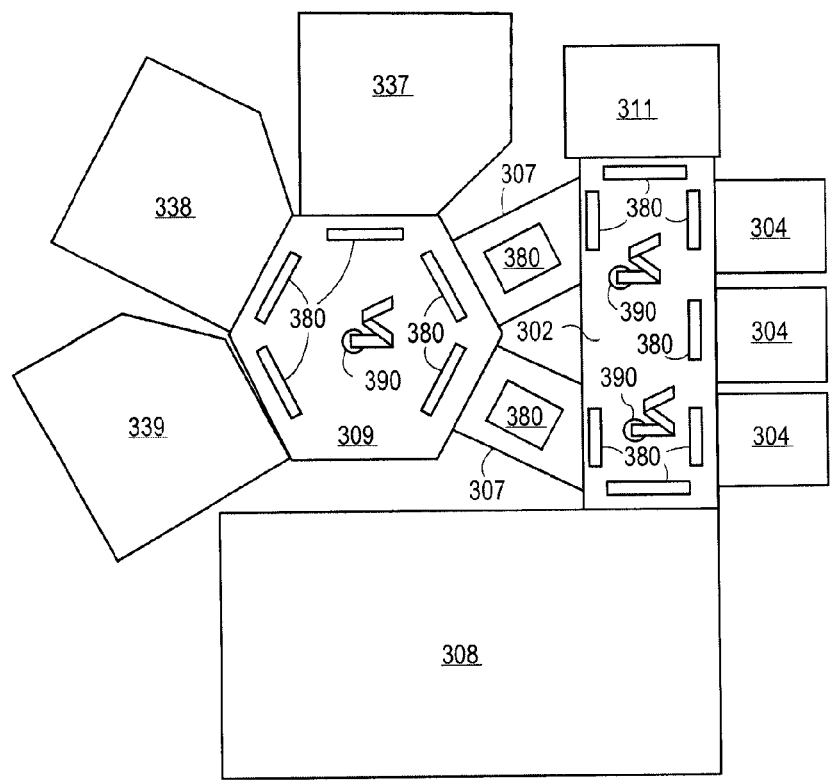
FIG. 3A illustrates an overhead block diagram of a process tool including a plurality of outgassing stations according to an embodiment of the invention.

According to embodiments of the invention, the outgassing of the workpiece may be performed at one or more outgassing stations 380 that are integrated into a process tool, such as the process tool 300 described with respect to FIG. 3A. Process tool 300 may be substantially similar to process tool 100 described with respect to FIG. 1, with the exception that process tool 300 may include an outgassing station 380 or a plurality of outgassing stations 380, according to embodiments of the invention. By way of example, the outgassing stations 380 may be located within a load lock, the transfer chamber, and/or the factory interface. As illustrated in FIG. 3A, a plurality of outgassing stations 380 may be formed throughout the process tool 380, however embodiments are not limited to such configurations. For example, an outgassing station 380 may be located at a single location within the process tool.

Figure 3B:
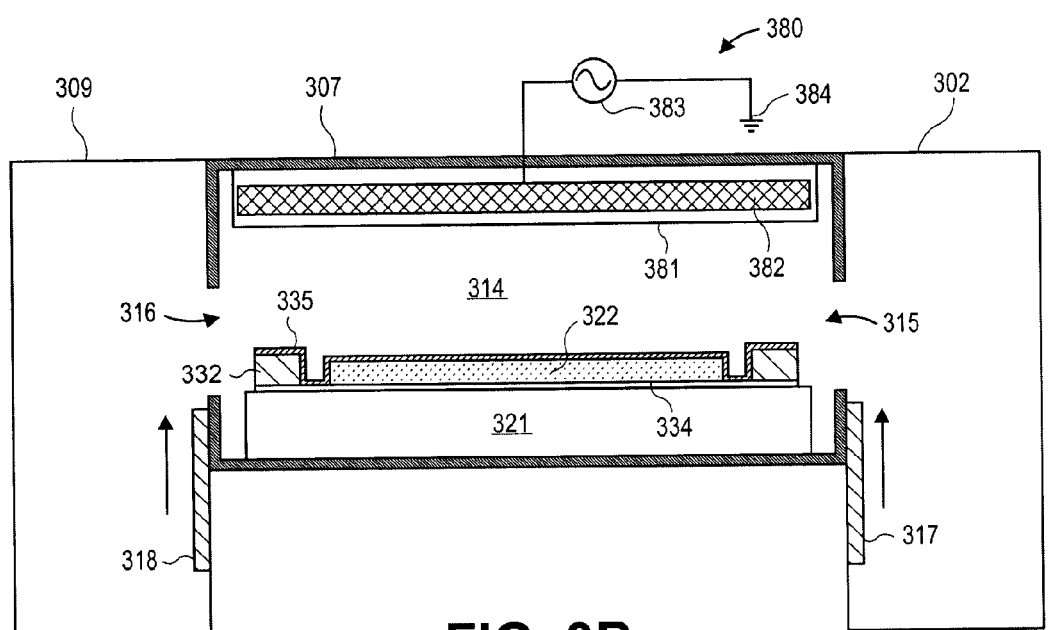
FIG. 3B is a cross-sectional illustration of a load lock that includes an outgassing station according to an embodiment of the invention.

Referring now to FIG. 3B, a cross-sectional illustration of a load lock 307 that includes an outgassing station 380 is shown according to an embodiment of the invention. Performing the outgassing process in the load lock 307 is beneficial because the outgassed moisture is evacuated from the environment by the load lock's vacuum pump (not shown) as the load lock 307 is being pumped down to the vacuum pressure. As such, even if the temperature of the workpiece decreases after the outgassing process is completed, the mask layer 335 will not be able to reabsorb moisture because the moisture has been removed from the load lock 307. Additionally, the amount of outgassing and the rate at which the outgassing occurs may be increased when the workpiece is heated while in an environment with a lower pressure. Furthermore, according to embodiments, when the workpiece 330 is removed from the load lock 307 and transferred to the processing chamber 337, the workpiece will pass through the transfer chamber 309, which is also maintained at a vacuum pressure. Accordingly, the workpiece will not be able to reacquire moisture that would be susceptible to outgassing in the processing chamber.

As shown in FIG. 3B, the load lock 307 couples the factory interface 302 to the transfer chamber 309. The load lock 307 is the gateway within the process tool that allows the workpieces 330 to be transferred from the atmospheric pressure of the factory interface 302 to the vacuum pressure of the transfer chamber 309. As such, the load lock 307 may include a first opening 315 that provides access from the factory interface 302 to the load lock 307. A workpiece 330 may be inserted through the first opening 315 and placed on a pedestal 321 in the load lock 307. By way of example, the workpiece may be inserted into the load lock 307 by a transfer robot (not shown) that is described in greater detail below. When a workpiece has been placed onto the pedestal 321, the first opening may be sealed by a first door 317 that may be positioned over the first opening 315 as indicated by the arrow. The load lock 307 may then be pumped down to the vacuum pressure. In an embodiment, the vacuum pressure may be a pressure that is less than atmospheric pressure. By way of example, the vacuum pressure may be below approximately 1.0 mTorr. Additional embodiments include a vacuum pressure between approximately 1.0 mTorr and $1.0 \times 10^{-9}$ mTorr. Once the vacuum pressure has been reached, a second door 318 may be opened to form a second opening 316 that provides access from the load lock 307 to the transfer chamber 309. As such, the transfer chamber 309 and the one or more processing chambers 337 attached to the transfer chamber 309 may be maintained at a vacuum pressure while a plurality of workpieces are processed.

Embodiments of the invention utilize the time it takes to produce the vacuum in the load lock 307 to outgas the workpiece. In an embodiment, the load lock 307 may include an outgassing station 380 for outgassing the workpiece 330. In an embodiment, the outgassing station 380 includes a heating device 382 that can raise the temperature of the workpiece 330 as the workpiece 330 sits on the pedestal 321. By way of example, the heating device 382 may be a vacuum compatible heating device, such as an infrared lamp. While a single infrared lamp is illustrated in FIG. 3B, it is to be appreciated that embodiments of the invention may also include a heating device 382 that has a plurality of infrared lamps. According to an embodiment, the heating device 382 may be powered by a power source 383 that is attached to a ground 384 outside of the load lock 307.

According to an embodiment, as the load lock 307 pumps down to a vacuum pressure, the workpiece is heated by the heating device 382 to an outgassing temperature sufficient to cause moisture to outgas from the mask layer 335. According to an embodiment, the heating may cause substantially all of the moisture, other trapped gasses, and/or solvents in the mask layer 335 to outgas. In an embodiment, the heating device 382 may heat the workpiece to an outgassing temperature that is approximately 45° C. or greater. According to an embodiment, the workpiece may be heated to an outgassing temperature that is between approximately 45° C. and 120° C. By way of example, the load lock may reach a vacuum pressure of approximately 0.05 mTorr or less. In an embodiment, the load lock may reach a pressure of approximately 0.01 mTorr or less. In such embodiments, the combination of low pressure and a heated workpiece 330 allow for rapid outgassing of the mask layer 335. In an embodiment, the remaining pressure in the load lock 307 may be produced by the presence of a nonreactive gas, such as He gas, Ar gas $N_2$ gas, or the like that was pumped into the load lock 307 prior to pumping down the load lock 307 to a vacuum pressure. According to an additional embodiment, the pressure of the load lock 307 may be pumped down to a pressure that is below the pressure of the transfer chamber 309. In such embodiments, the lower pressure obtained in the load lock 307 may be beneficial because the lower pressure allows for increased outgassing of the mask layer 335 prior to transferring the workpiece into the transfer chamber 309.

According to an additional embodiment, an enclosure 381 that is transparent to infrared radiation may optionally be formed around the heating device 382 in order to isolate the heating device 382 from the workpiece. Such embodiments may provide a cleaner environment for the workpiece. For example, a heating device 382 without an enclosure 381 may generate particulates that could be disposed onto the workpiece. By way of example, the enclosure 381 may be a quartz glass material.

According to an additional embodiment of the invention, one or more outgassing stations 380 may be located within the transfer chamber 309, as illustrated in FIG. 3A. For example, the outgassing stations 380 may be positioned proximate to one or more openings through which the workpiece may be transferred by a transfer robot 390. Accordingly, in an embodiment, an outgassing station 380 may be positioned in the transfer chamber 309 proximate to the opening of one or more of the processing chambers 337.

For example, in FIG. 3C an outgassing station 380 is positioned proximate to the chamber opening 314 of the plasma processing chamber 337. In an embodiment, as the transfer robot 390 transfers the workpiece 330 through the opening 314 in order to place the workpiece onto the chuck 323, the workpiece 330 may be heated by the heating element 382 of the outgassing station 380. An embodiment may also include an outgassing station 380 positioned proximate to the second opening of the load lock 307. Since the workpiece needs to pass through the openings, such as chamber opening 314, in order to be processed, the outgassing process does not increase the processing time for each workpiece. While embodiments described above include outgassing stations 380 that are formed proximate to openings, embodiments are not limited to such configurations. By way of example, an outgassing station 380 may be positioned at any location within the transfer chamber 309.

According to an embodiment, the workpieces are transferred through outgassing stations 380 by one or more transfer robots 390 that are located in the transfer chamber 309. As illustrated in FIG. 3C, the robot 390 includes a robot drive 391, according to an embodiment. A robot shaft 392 may extend out of a top surface of the robot drive 391 in order to enable the robot to raise or lower the level of an end effector 385. In an embodiment, the robot shaft 392 is driven by a piston or a lead screw. According to an embodiment, the robot arm may be a selective compliance articulated robot arm (SCARA) or any other robot used for transferring workpieces. For example, a first arm 393 may be rotatably coupled to the robot shaft 392. A second arm 394 may be rotatably coupled to the free end of the first arm 393. An end effector 385 may be rotatably coupled to the free end of the second arm 394.

According to an embodiment, as the transfer robot 390 transfers the workpiece from the load lock 307 to a processing chamber 337, such as a plasma etch chamber, the workpiece 330 may pass below one or more outgassing stations 380. According to an embodiment, the outgassing stations may include a heating device 382, such as an infrared heating device. In an embodiment the heating device 382 may be surrounded by an enclosure 381 that is transparent to infrared radiation. By way of example, the enclosure 381 may be a quartz glass enclosure. As illustrated, embodiments of the invention may include a plurality of heating devices within the transfer chamber. According to an embodiment, the heating device 382 may be powered by a power source 383 that is attached to a grounded 384 outside of the transfer chamber 309.

According to an embodiment, the amount of outgassing obtained at each outgassing station 380 may be increased by changing the speed that the workpiece 330 passes below the heating device 382. By way of example, when additional outgassing is needed, the transfer robot 390 may reduce the speed with which the transfer robot 390 transfers the workpieces 330 between the load lock and a processing chamber. In additional embodiments, if an outgassing operation has already been implemented at an outgassing station 380 within the load lock 307, then the speed that the transfer robot 390 transfers the workpieces 330 through the outgassing stations 380 in the transfer chamber 309 may be increased since less outgassing will be needed to substantially remove all moisture form the mask layer 335.

According to an additional embodiment illustrated in FIG. 3D, outgassing stations 380 may also be located within the factory interface 302. By way of example, an outgassing station may be located proximate to any of the openings through which a workpiece may be transferred. As illustrated in FIG. 3A, an outgassing station 380 may be located proximate to the load port 304, the spin coating tool 311, the load locks 307, and/or the laser scribe tool 308. A cross-sectional illustration of the factory interface 302 illustrated in FIG. 3D shows an outgassing station 380 located proximate to a load lock 307 and a load port 304 on which a FOUP 310 is supported.

According to an embodiment the outgassing stations 380 within the factory interface may be substantially similar to those described above with respect to FIGS. 3B and 3C. For example, the outgassing station 380 may include a heating element 382. In an embodiment, the heating element is an infrared heating element, such as an infrared lamp. Additionally, embodiments of the invention include outgassing stations 380 that include a heating device 382 that is a convection heating element. Such embodiments are possible because the factory interface 302 may not be maintained at a vacuum pressure. By way of example, a convection heating element may include passing air over a resistively heated filament and directing the heated air towards the workpiece. In an embodiment, the restively heated filament may be a tungsten filament.

Even though the outgassing stations 380 within the factory interface are not at a vacuum pressure, embodiments that utilize outgassing stations within the factory interface provide several benefits. First, the outgassing stations 380 in the factory interface are still capable of producing outgassing in the mask layer 335 because they heat the workpiece. Additionally, by preheating the workpiece with the outgassing stations 380 in the factory interface 302, subsequent outgassing process that may be implemented at outgassing stations 380 within the load lock 307 or within the transfer chamber 309 are more efficient. For example, the time needed to initially raise the temperature of the workpiece 330 to the outgassing temperature is no longer needed since the workpiece has already been heated in the factory interface 302.

According to yet another embodiment, an outgassing station may also be located within a FOUP. Including an outgassing station in a FOUP allows for outgassing to be performed prior to the workpiece even reaching the process tool when the spin coating tool is not integrated with the process tool. In such embodiments, the mask layer may experience absorption of moisture as the workpiece is transferred from the spin coating tool to the process tool unless the temperature of the workpiece is maintained at an elevated temperature. For example, embodiments of the invention include maintaining the temperature of the workpiece above approximately 40° C. as the workpiece is being transferred within the FOUP.

Figure 4A:
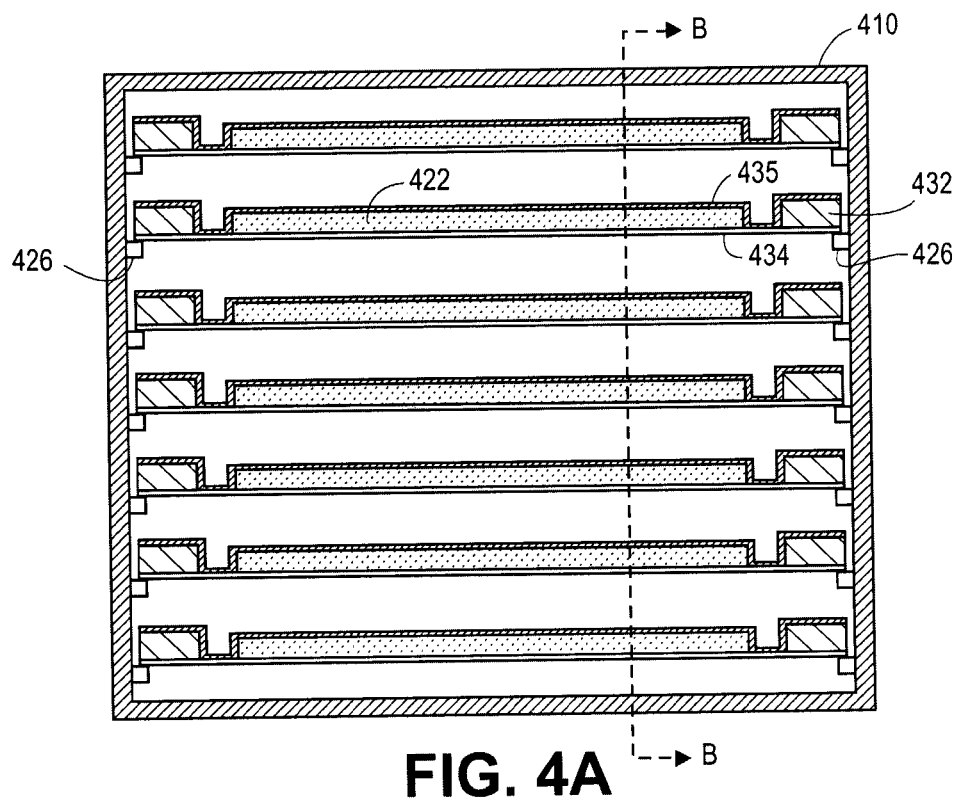
FIGS. 4A and 4B are cross-sectional illustrations of a front opening unified pod (FOUP) that includes an outgassing station according to an embodiment of the invention.
Figure 4B:
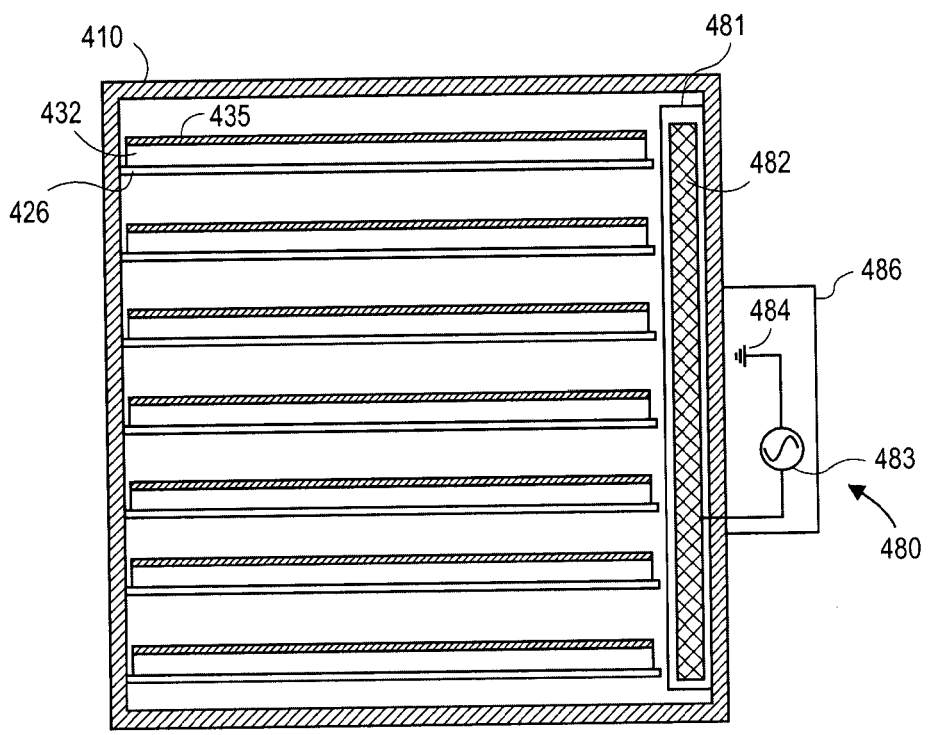

Referring now to FIGS. 4A and 4B, a FOUP 410 that includes an outgassing station according to an embodiment invention is illustrated. In FIG. 4A, the FOUP is illustrated from the front with each workpiece 430 spanning between two slots 426. Referring now to FIG. 4B, a side view along line B-B in FIG. 4A is illustrated. As shown, the slots 426 may not extend entirely along the length of the side walls of the FOUP 410. In an embodiment, a space is reserved for the outgassing station 480.

In an embodiment the outgassing station 480 may include a heating element 482. By way of example, the heating element 482 may be an infrared heating element, such as an infrared lamp. While a single heating element 482 is shown, it is appreciated that one or more heating elements may be used according to embodiments of the invention. Additionally, while the heating element 482 is illustrated as being formed along a single wall of the FOUP 410, embodiments may include a plurality of heating element 482 that are formed along multiple walls of the FOUP 410. In addition to the heating element 482, embodiments may also include an enclosure 481 that is transparent to infrared radiation in order to isolate the heating element from the workpieces 430.

Additional embodiments include a heating element 482 that is a convection heating element. For example, the convection heating element may be substantially similar to the convection heating element described above with respect to FIG. 3D. By way of example, a resistively heated filament may be used to heat airflow that is directed to pass over the workpieces stored on the slots 426. In an embodiment, the FOUP may also include an exhaust system to vent moisture that has been outgassed by the workpieces.

According to an embodiment, the FOUP 410 may include a battery pack 486 that is used to power the outgassing station. In an embodiment, the battery pack 486 may be a rechargeable battery pack. By way of example, the battery pack 486 may be charged when the FOUP is docked at a load port or any other docking station.

Figure 5A:
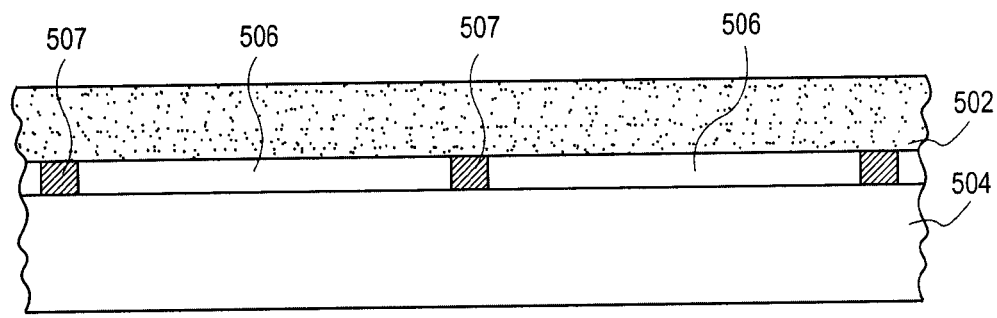
FIGS. 5A-5C illustrate cross-sectional views of a semiconductor wafer including a plurality of integrated circuits during a method of dicing a semiconductor wafer, according to an embodiment of the invention.

According to an embodiment, workpieces that include a mask layer and that are outgassed according to embodiments described herein may be processed in a process tool, such as process tool 300 described in FIG. 3A. In an embodiment, processing may include a hybrid laser and etch singulation process. For example, a hybrid laser and etch singulation process may include a process such as the one illustrated in FIGS. 5A-5C. Referring to FIG. 5A, a mask 502 is formed above a semiconductor wafer or substrate 504. The mask 502 is composed of a layer covering and protecting integrated circuits or devices 506 formed on the surface of semiconductor wafer 504. The mask 502 also covers intervening streets 507 formed between each of the integrated circuits or devices 506. By way of example, the mask 502 may be a water soluble polymeric material, such as PVA or PVC.

Figure 5B:
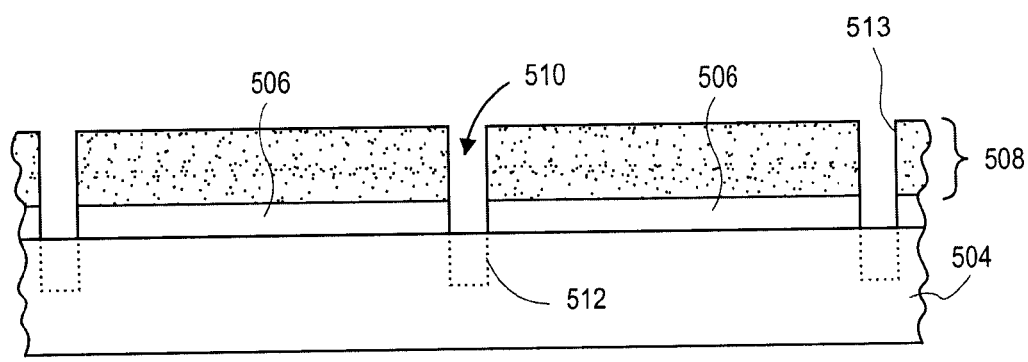

Referring to FIG. 5B, the mask 502 is patterned with a laser scribing process to provide a patterned mask 508 with gaps 510, exposing regions of the semiconductor wafer or substrate 504 between the integrated circuits or devices 506. As such, the laser scribing process is used to remove the material of the streets 507 originally formed between the integrated circuits or devices 506. In accordance with an embodiment of the present invention, patterning the mask 502 with the laser scribing process further includes forming trenches 512 partially into the regions of the semiconductor wafer 504 between the integrated circuits or devices 506, as depicted in FIG. 5B.

As illustrated in FIG. 5B, the laser scribing process exposes sidewall portions 513 during the formation of the patterned mask 508. As such, the overall surface area of the patterned mask 508 is increased relative to an unpatterned mask 535. Embodiments of the invention utilize the increase in the surface area of the patterned mask 508 to increase the rate at which outgassing occurs at an outgassing station. For example, after the laser scribing process, the semiconductor wafer may be transferred to a load lock that includes an outgassing station according to an embodiment described herein prior to performing the etching process illustrated in FIG. 5C. A workpiece with a patterned mask 508 will therefore outgas at a faster rate, and more completely, compared to a workpiece with a mask that is substantially similar, but that is not patterned.

Figure 5C:
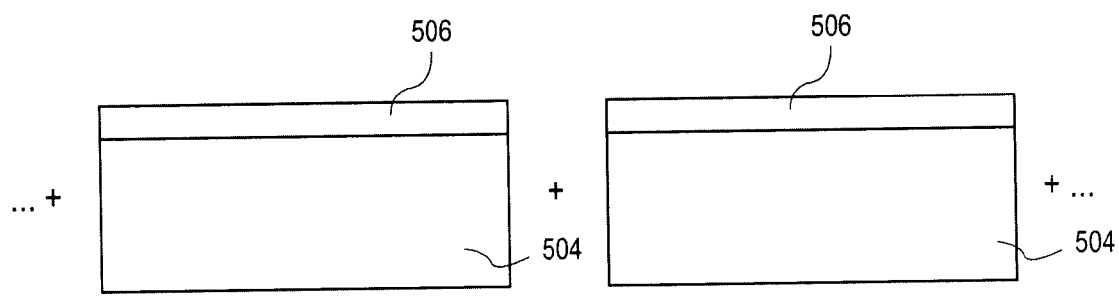

Referring to FIG. 5C, after the workpiece is outgassed at an outgassing station, the semiconductor wafer 504 is etched through the gaps 510 in the patterned mask 508 to singulate the integrated circuits or devices 506. In accordance with an embodiment of the present invention, etching the semiconductor wafer 504 includes ultimately etching entirely through semiconductor wafer 504, as depicted in FIG. 5C, by etching the trenches 512 initially formed with the laser scribing process. In one embodiment, the patterned mask 508 is removed following the plasma etching, as is also depicted in FIG. 5C.

Accordingly, referring again to FIGS. 5A-5C, wafer dicing may be performed by initial ablation using a laser scribing process to ablate through a mask layer, through wafer streets (including metallization) and, possibly, partially into a substrate or wafer. The mask layer may then be outgassed at an outgassing station. Die singulation may then be completed by subsequent through-substrate plasma etching, such as through-silicon deep plasma etching.

While embodiments described herein include a process tool that includes at least a load port, a factory interface, a transfer chamber, a spin coating tool, a laser scribe tool and a processing chamber, embodiments are not limited to such configurations. For example, a process tool may only include a load lock and a processing chamber. Additional embodiments may include a processing chamber and any combination of one or more components, such as, for example, a load port, a factory interface, a transfer chamber, a spin coating tool, and a laser scribe tool. In such embodiments, one or more outgassing stations may be located within any of the additional components included in the process tool.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 300 described in association with FIG. 3A. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
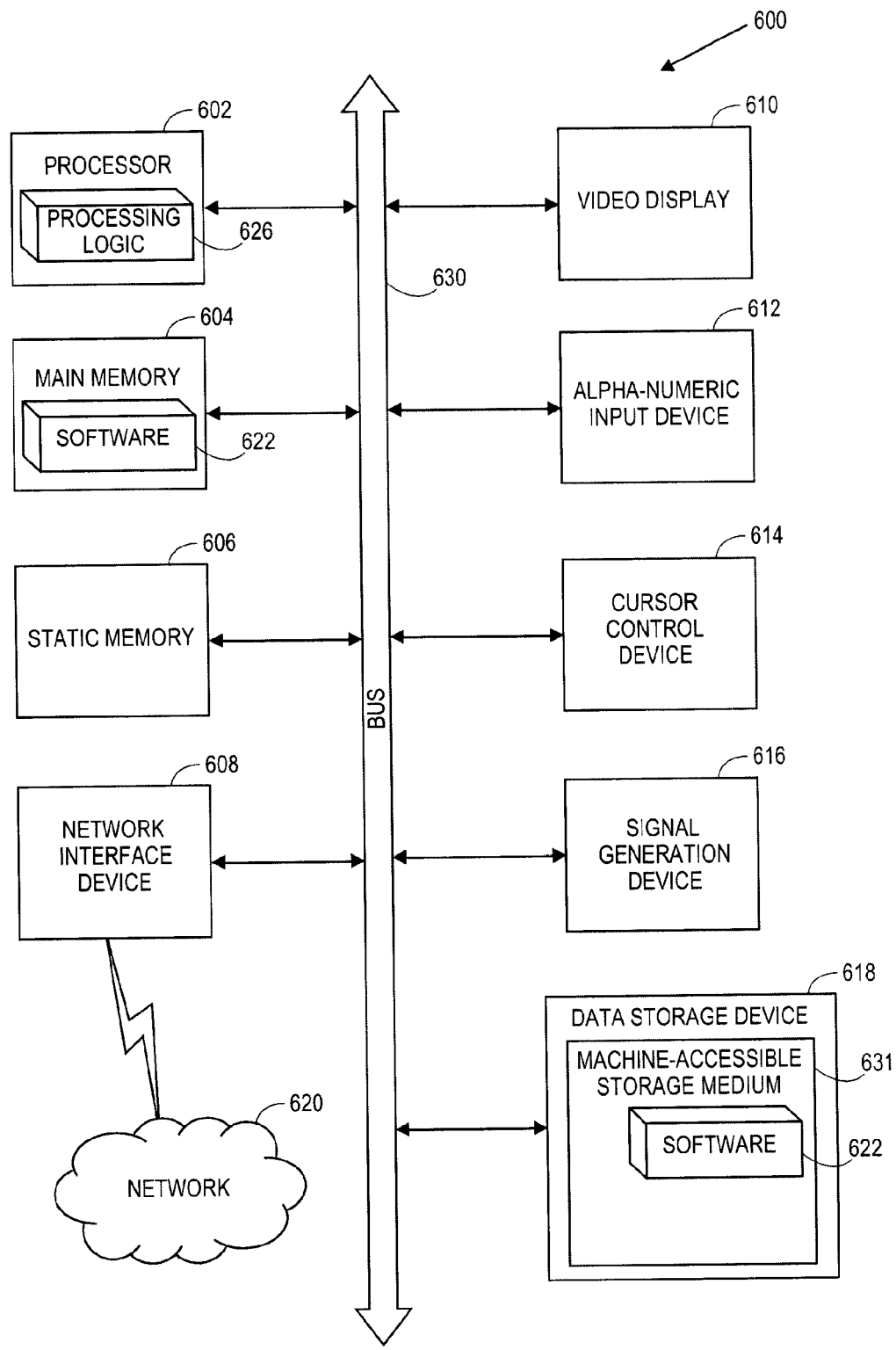
FIG. 6 illustrates a block diagram of an exemplary computer system, according to an embodiment of the invention.

FIG. 6 illustrates a diagrammatic representation of a machine in the exemplary form of a computer system 600 within which a set of instructions may be executed for causing the machine to perform any one or more of the methodologies described herein for controlling a process tool, such as process tool 300 described in association with FIG. 3A, in order to outgas a workpiece. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of embodiments of the present invention. The term "machine-readable storage medium" shall accordingly be taken to include, but not be limited to, solid-state memories, and optical and magnetic media.

What is claimed is:
1. A method for outgassing a workpiece, comprising:
transferring a workpiece having a mask to an outgassing station having one or more heating elements;

heating the workpiece to an outgassing temperature that causes moisture from the mask layer to be outgassed; and transferring the workpiece to a plasma processing chamber after the mask layer has been outgassed, wherein the outgassing station is within a transfer chamber that is coupled to the plasma processing chamber.

2. The method of claim 1, wherein the transfer chamber and the plasma processing chamber are in a process tool that further comprises a factory interface and a load lock coupled to the factory interface, and wherein the transfer chamber is further coupled to the load lock.

3. A method for outgassing a workpiece, comprising:
transferring a workpiece having a mask to an outgassing station having one or more heating elements;
heating the workpiece to an outgassing temperature that causes moisture from the mask layer to be outgassed; and
transferring the workpiece to a plasma processing chamber after the mask layer has been outgassed, wherein the outgassing station is within a process tool that comprises a factory interface, a load lock coupled to the factory interface, a transfer chamber coupled to the load lock, and the plasma processing chamber coupled to the transfer chamber, and wherein the outgassing station is within the load lock.

4. The method of claim 3, wherein the one or more heating elements are vacuum compatible lamps.

5. The method of claim 3, further comprising:
pumping down the load lock to a vacuum pressure when the workpiece is in the load lock, and wherein the workpiece is heated while the load lock is pumped down to a vacuum pressure.

6. The method of claim 5, wherein the vacuum pressure is less than 0.05 mTorr.

7. The method of claim 2, wherein the outgassing station is positioned in the transfer chamber proximate to an opening to the load lock, and wherein the workpiece is heated as the workpiece is transferred from the load lock to the transfer chamber.

8. The method of claim 1, wherein the outgassing station is positioned in the transfer chamber proximate to an opening to the plasma processing chamber, and wherein the workpiece is heated as the workpiece is transferred from the transfer chamber to the plasma processing chamber.

9. The method of claim 1, further comprising:
forming one or more openings in the mask layer prior transferring the workpiece to the outgassing station.

10. The method of claim 9, wherein the openings are formed with a laser scribing tool.

11. The method of claim 1, wherein the workpiece is maintained in a vacuum environment after the workpiece is heated to the outgassing temperature at the outgassing station and until the workpiece has been processed in the plasma processing chamber.

12. A method of outgassing a workpiece comprising:
forming a mask layer over a workpiece;
transferring the workpiece to a process tool that comprises a factory interface, a load lock coupled to the factory interface, a transfer chamber coupled to the load lock, and a plasma processing chamber coupled to the transfer chamber, wherein the process tool has one or more outgassing stations each having one or more heating elements;
transferring the workpiece to an outgassing station within the process tool;
heating the workpiece to an outgassing temperature that causes moisture from the mask layer to be outgassed; and
transferring the workpiece to the plasma processing chamber after the mask layer has been outgassed.

13. The method of claim 12, wherein the outgassing station is within the load lock.

14. The method of claim 13, further comprising:
pumping down the load lock to a vacuum pressure when the workpiece is in the load lock, and wherein the workpiece is heated while the load lock is pumped down to a vacuum pressure.

\* \* \* \* \*